United States Patent
Geiger et al.

(10) Patent No.: US 9,608,181 B2
(45) Date of Patent: Mar. 28, 2017

(54) OPTO-ELECTRONIC MODULES WITH MASKING FEATURE FOR REDUCING THE VISIBILITY OF INTERIOR COMPONENTS

(71) Applicant: Heptagon Micro Optics Pte. Ltd., Singapore (SG)

(72) Inventors: Jens Geiger, Thalwil (CH); René Kromhof, Thalwil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/649,425

(22) PCT Filed: Dec. 17, 2013

(86) PCT No.: PCT/SG2013/000537
§ 371 (c)(1),
(2) Date: Jun. 3, 2015

(87) PCT Pub. No.: WO2014/098768
PCT Pub. Date: Jun. 26, 2014

(65) Prior Publication Data
US 2016/0072029 A1    Mar. 10, 2016

Related U.S. Application Data

(60) Provisional application No. 61/740,115, filed on Dec. 20, 2012.

(51) Int. Cl.
*H01L 27/15* (2006.01)
*H01L 29/267* (2006.01)
(Continued)

(52) U.S. Cl.
CPC .............. *H01L 33/58* (2013.01); *G02B 5/003* (2013.01); *H01L 33/483* (2013.01);
(Continued)

(58) Field of Classification Search
CPC ......... H01L 33/20; H01L 33/32; H01L 33/38; H01L 33/44; H01L 33/54; H01L 33/60;
(Continued)

(56) References Cited

U.S. PATENT DOCUMENTS

| | | | |
|---|---|---|---|
| 4,135,813 A * | 1/1979 | Frank .................... | G03B 27/727 355/71 |
| 5,196,682 A | 3/1993 | Englehardt | |
| 5,400,072 A * | 3/1995 | Izumi .................... | H04N 5/2253 348/335 |
| 6,898,030 B1 * | 5/2005 | Lin ........................ | G02B 7/021 359/740 |
| 2004/0126072 A1 * | 7/2004 | Hoon Lee .............. | B82Y 10/00 385/122 |
| 2006/0027828 A1 * | 2/2006 | Kikuchi .................. | H01L 33/58 257/99 |
| 2006/0078262 A1 | 4/2006 | Chen | |
| 2006/0132777 A1 * | 6/2006 | Hubble ..................... | G01J 3/10 356/402 |
| 2008/0179609 A1 * | 7/2008 | Trottier ................... | H01L 33/44 257/98 |
| 2009/0052288 A1 * | 2/2009 | Eno ........................ | G01S 7/4813 369/53.11 |
| 2010/0309369 A1 * | 12/2010 | Jarvis ................... | H04N 5/2254 348/371 |
| 2011/0050979 A1 * | 3/2011 | Rudmann ......... | H01L 27/14623 348/335 |
| 2012/0243091 A1 | 9/2012 | Amm et al. | |
| 2012/0320934 A1 * | 12/2012 | Yoon ..................... | H01S 3/0675 372/6 |
| 2013/0021425 A1 * | 1/2013 | Fujita ..................... | G11B 7/126 347/249 |

(Continued)

FOREIGN PATENT DOCUMENTS

DE    102008013925    * 5/2009    .......... G02F 1/3523

OTHER PUBLICATIONS

Australian Patent Office, International Search Report issued in PCT/SG013/000537 (Apr. 17, 2014).
(Continued)

*Primary Examiner* — Teresa M Arroyo
(74) *Attorney, Agent, or Firm* — Fish & Richardson P.C.

(57) ABSTRACT

Opto-electronic modules include masking features that can help reduce the visibility of interior components or enhance the outer appearance of the module or of an appliance incorporating the module as a component. The modules can include an optical diode or saturable optical absorber.

4 Claims, 6 Drawing Sheets

(51) Int. Cl.
   H01L 31/12 (2006.01)
   H01L 33/00 (2010.01)
   H01L 33/58 (2010.01)
   H01L 33/48 (2010.01)
   G02B 5/00 (2006.01)
   G03B 15/04 (2006.01)
   H04N 1/60 (2006.01)
   H01L 33/60 (2010.01)
   G03B 29/00 (2006.01)
   G03B 7/16 (2014.01)
   G03B 15/05 (2006.01)
   H01L 33/44 (2010.01)

(52) U.S. Cl.
   CPC .............. *H01L 33/486* (2013.01); *G03B 7/16* (2013.01); *G03B 15/04* (2013.01); *G03B 15/05* (2013.01); *G03B 29/00* (2013.01); *G03B 2215/05* (2013.01); *H01L 33/44* (2013.01); *H01L 33/60* (2013.01); *H04N 1/6086* (2013.01)

(58) Field of Classification Search
   CPC ................... H01L 33/62; H01L 33/486; H01L 2224/48091; H01L 2924/01079; H01L 33/58; H01L 33/483; H04N 1/6086; G02B 5/003; G03B 7/16; G03B 7/17; G03B 9/70; G03B 15/04; G03B 15/0405; G03B 15/041; G03B 15/0442; G03B 15/0457; G03B 15/0478; G03B 15/0484; G03B 15/0494; G03B 15/05; G03B 29/00; G03B 41/14; G03B 2215/05; G03B 2215/0596
   USPC .............................................. 257/81, 98, 99
   See application file for complete search history.

(56) References Cited

U.S. PATENT DOCUMENTS

2014/0246690 A1* 9/2014 Moosburger ........... G03B 15/02
                                                                257/98
2014/0361200 A1* 12/2014 Rudmann ............. H01L 25/167
                                                                250/578.1

OTHER PUBLICATIONS

Australian Patent Office, International Written Opinion issued in PCT/SG013/000537 (Apr. 17, 2014).

"Saturable Absorbers," Encyclopedia of Laser Physics and Technology, www.rp-photonics.com/saturable_absorbers.html , 5 pages (printed Nov. 29, 2012).

"Optical isolator," Wikipedia, en.wikipedia.org/wiki/Optical_isolator, 4 pages (printed Dec. 4, 2012).

* cited by examiner

OPTO-ELECTRONIC MODULES WITH MASKING FEATURE FOR REDUCING THE VISIBILITY OF INTERIOR COMPONENTS

CROSS-REFERENCE TO RELATED APPLICATION(S)

This application is a national phase of PCT/SG2013/000537, which claims priority from U.S. Provisional Application No. 61/740,115, filed on Dec. 20,2012.The entire contents of the earlier applications are incorporated herein by reference.

FIELD OF THE DISCLOSURE

The present disclosure relates to opto-electronic modules with a masking feature for reducing the visibility of interior components and/or enhance the outer appearance of the module or an appliance incorporating the module as a component.

BACKGROUND

Many electronic appliances, including consumer products, industrial appliances and medical devices, have a light emitting element for emitting optical signals outside the appliance and/or a light receiving element for sensing light received from outside the appliance. Depending on the particular application, the wavelength of the light to be emitted or detected may be in the ultra-violet (UV), infra-red (IR) or visual range. For some applications, particularly those that rely on light in the visual range (e.g., about 390 nm to about 750 nm), a small opening (e.g., a hole or slit) or window may be provided in the housing (e.g., a casing) of the appliance so that the light can be emitted to an external location or so that light can be received from an external location. In some cases, one or more windows are provided in the housing so that optical signals in the visible range can be emitted as well as received by opto-electronic components inside the appliance. For example, some mobile phones include a window in their housing so that optical signals can be received by a camera integrated within the phone. A second window adjacent the first window may be provided so that light from a flash inside the phone can be emitted when a photograph is to be taken using the camera.

Although such openings or windows in the housing of the appliance may be important to facilitate various functions, the windows may detract from the overall appearance of the appliance. For example, the housing may be made of one material, whereas the windows may be made of a different material. This can result in an outer surface of the appliance that does not have a very uniform appearance. The presence of windows or other openings in the housing also may make some of the internal components visible to someone looking at the appliance. This may be undesirable in some cases either for functional or aesthetic reasons.

SUMMARY

The present disclosure describes various opto-electronic modules that, in some implementations, include masking features that can help reduce the visibility of interior components and/or enhance the outer appearance of the module or an appliance incorporating the module as a component.

For example, in one aspect, an opto-electronic module includes an opto-electronic device to emit or sense light, and a cover over the opto-electronic device. The cover includes an optical diode and serves as at least part of an exterior wall of the opto-electronic module. The technical principles of an optical diode are explained below in more detail. In some implementations, light in the visible spectrum that passes through the optical diode and subsequently is reflected by an interior surface of the opto-electronic module back toward the optical diode is not visible outside the module. In some implementations, the opto-electronic device is a light emitting element that emits light at a particular wavelength or in a particular range in the visible spectrum. The light emitted by the opto-electronic device can pass through the optical diode such that the light from the opto-electronic device is visible outside the module.

According to another aspect, an opto-electronic module includes an opto-electronic device to emit or sense light, and a cover over the opto-electronic device. The cover includes a saturable optical absorber and serves as at least part of an exterior wall of the opto-electronic module. The technical principles of a saturable optical absorber are explained below in more detail. The opto-electronic device can be, for example, a light emitting element. When the light emitting element is turned off, the saturable optical absorber is absorptive, such that light impinging on the module is substantially absorbed. On the other hand, when the light emitting element is turned on, it emits light at an intensity that causes the saturable optical absorber to become transparent so that the emitted light passes through the saturable optical absorber and can be seen outside the module.

Thus, the disclosure describes opto-electronic modules that include a housing and an opto-electronic device inside the housing, wherein the opto-electronic device is configured to emit light at a particular wavelength or range of wavelengths. The housing includes means for filtering light that impinges on an outer surface of the housing such that light in the visible part of the spectrum impinging on the outer surface of the housing where the means for filtering is located is substantially absorbed by the means for filtering or is substantially prevented from passing back out of the housing through the means for filtering. The means for filtering also can, in some implementations, allow this light to reenter the housing to be detected by light sensitive components in the same housing (e.g., a camera or flash). The means for filtering allows light emitted by the opto-electronic device at the particular wavelength or range of wavelengths to pass out of the housing through the means for filtering. In some implementations, the particular wavelength or range of wavelengths of light emitted by the opto-electronic device also can be in the visible part of the spectrum, although in other implementations, it may be, for example, in the IR or near-IR part of the spectrum.

The disclosure also describes opto-electronic modules that include a housing, and an opto-electronic device inside the housing, wherein the opto-electronic device is configured to sense light at a particular wavelength or range of wavelengths (e.g., in the IR or near-IR part of the spectrum). The housing includes means for filtering light that impinges on an outer surface of the housing such that the light in the visible part of the spectrum impinging on the outer surface of the housing where the means for filtering is located is substantially absorbed by the means for filtering or is substantially prevented from passing back out of the housing through the means for filtering, and wherein the means for filtering allows light at the particular wavelength or range of wavelengths to pass through the means for filtering into an interior area of the housing so as to be sensed by the opto-electronic device.

These and other modules described in this disclosure can be integrated into various types of appliances (e.g., consumer products, industrial appliances and medical devices).

Various advantages can be obtained in some implementations. For example, the side of the module containing the optical diode or the saturable optical absorber can provide a sealed surface, while also serving as a window that restricts the light that is able to pass through. In some implementations, the optical diode or the saturable optical absorber can allow the desired light to pass with little optical distortion.

Other aspects, features and advantages will be readily apparent from the following detailed description, the accompanying drawings and the claims.

DETAILED DESCRIPTION

Figure 1:
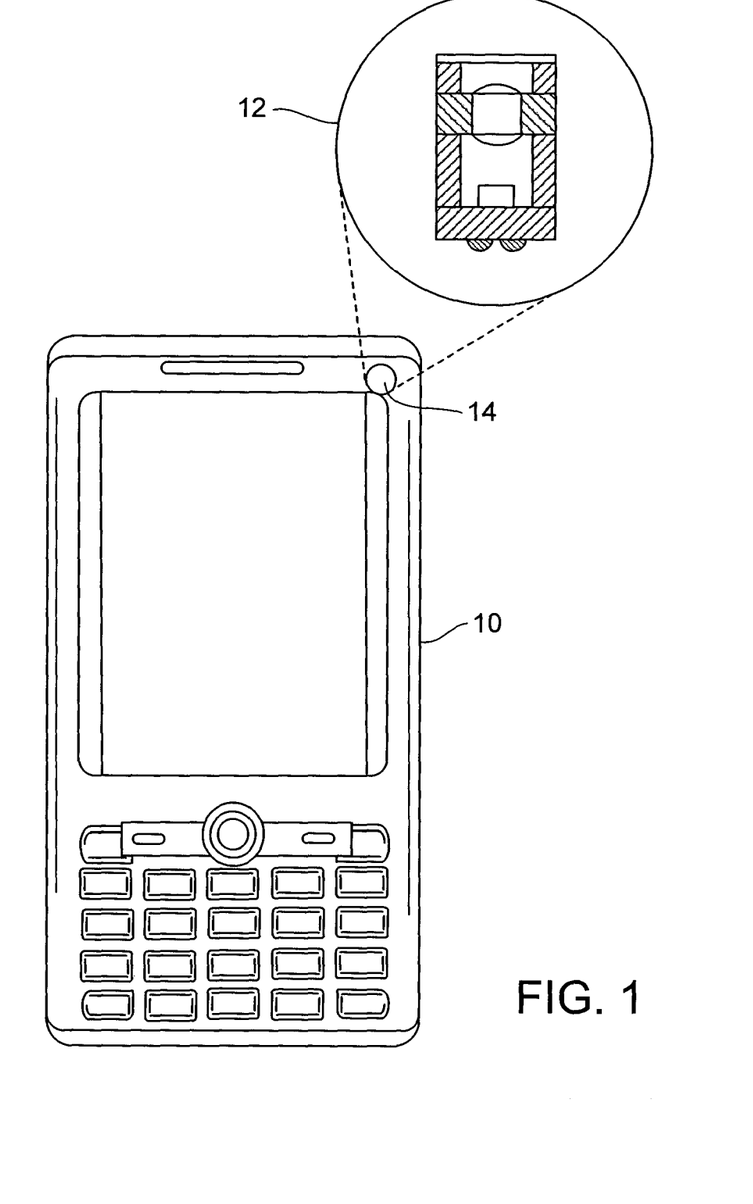
FIG. 1 illustrates an example of an electronic appliance that incorporates an opto-electronic module.

As shown in FIG. 1, a mobile handheld phone 10, which is an example of an electronic appliance, includes an opto-electronic module 12 such as a flash within its housing. Module 12 may be used, for example, in conjunction with a camera that also is integrated within the mobile phone 10 and can be interconnected to other components of the electronic appliance 10, which may include, for example, a processor, memory, an input/output device such as a display, a communication interface, and a transceiver, among other components. The various components can be interconnected using various buses, and several of the components may be mounted on a common motherboard or in other manners as appropriate. In some implementations, the opto-electronic component can be mounted on the common motherboard with some of the other components. Other examples of the opto-electronic module include a sensor (e.g., a proximity sensor).

Some or all of the outer surfaces of electronic appliance 10 can be composed of light blocking material. This may be done, in some implementations, either for aesthetic or functional reasons (e.g., to reduce the amount of stray light entering the housing). For example, at least some of the outer surfaces may be composed of a black material that absorbs a significant amount of, and preferably substantially all, the light in the visible spectrum that impinges on those surfaces of the mobile phone or other electronic appliance.

A surface of mobile phone 10 includes a window 14 that permits light emitted by the opto-electronic module 12 (e.g., the flash) to exit the housing of mobile phone 10. Opto-electronic module 12 can be located directly below the window 14. If the window is composed, for example, of a transparent glass or plastic material, then opto-electronic module 12 or other components in the housing may be visible from the outside. In various applications, however, it may be desirable to mask the interior components of the mobile phone 10 so that they are not readily visible when viewed from outside the housing (e.g., when looking at window 14). The following paragraphs describe examples of opto-electronic module 12 that include a cover which serves as window 14, but which also helps make the module less readily visible.

Figure 2:
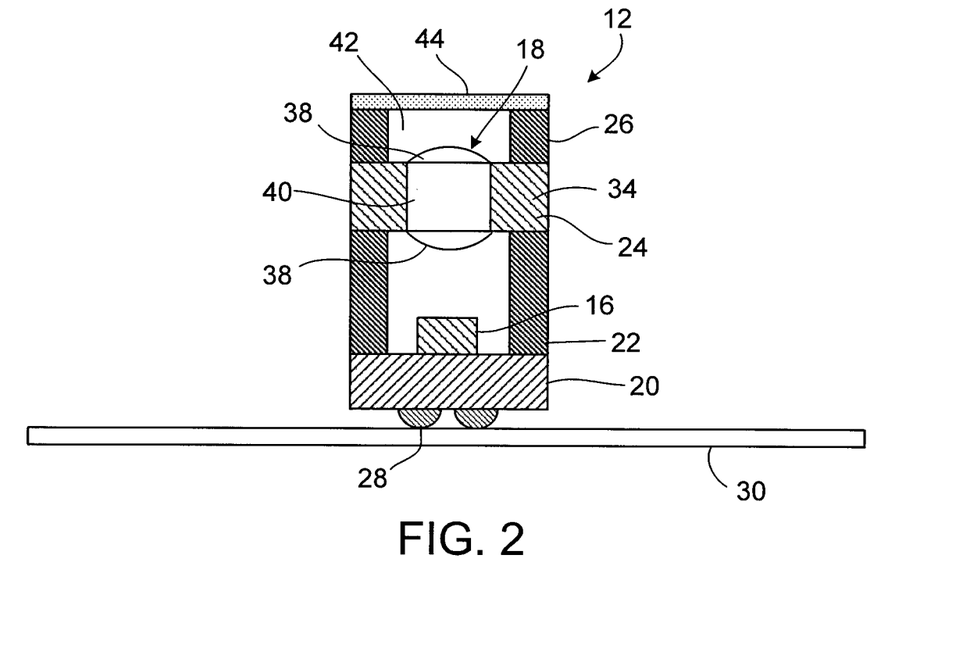
FIG. 2 shows an example of an opto-electronic module.

An example of opto-electronic module 12 is illustrated in FIG. 2. As illustrated in FIG. 2, opto-electronic module 12 includes at least one active optical component 16 (e.g., a light emitting component, such as a LED, an OLED or a laser chip) and at least one passive optical component 18. Examples of passive optical component 18 include an optical component that redirects light by refraction and/or diffraction and/or reflection such as a lens, a prism, a mirror or an optical system (e.g., a collection of passive optical components that may include mechanical elements such as aperture stops, image screens or holders).

The illustrated module 12 includes several constituents (20, 22, 24, 26) stacked upon each other in the vertical direction. In particular, module 12 includes a substrate 20, a separation member 22, an optics member 24 and a baffle member 26 stacked upon each other. Substrate 20 is, for example, a printed circuit board assembly. On the substrate 20 is mounted the active optical component 16 for emitting light. Electrical contacts of active optical component 16 are connected electrically to outside module 12, where solder balls 28 are attached. Instead of providing solder balls 7, some implementations include contact pads on substrate 20 which may be provided with solder balls at a later time. Module 12 thus can be mounted on a printed circuit board 30, e.g., using surface mount technology (SMT), next to other electronic components. Printed circuit board 30 may be a constituent of electronic appliance 10.

Separation member 22 can have an opening 32, in which active optical component 16 is disposed. This way, active optical component 16 is laterally encircled by separating member 22. Although the opening is shown as substantially circular, it may have other shapes in some implementations.

Separation member 22 can fulfill several tasks. For example, it can ensure a well-defined distance between substrate 20 and optics member 24 (through its vertical extension) which helps to achieve well-defined light paths from active optics component 16 through optics member 24. In some implementations, separation member 22 is made of a polymer material, for example, a hardenable (e.g., curable) polymer material, such as an epoxy resin. Separating member 22 can be made, for example, of an epoxy containing carbon black.

In the illustrated example, optics member 24 includes a blocking portion 34 and a transparent portion to allow light emitted by active optical component 16 to leave module 12. Blocking portion 34 can be composed, for example, of a substantially non-transparent material, e.g., a suitable polymer material. Transparent portion comprises passive optical component 18 such as a lens for light guidance, which may include two lens elements 38 in close contact to a transparent portion 40. Transparent portion 40 can have the same vertical dimension as optics member 24 where it forms blocking portion 34, such that optics member 24 where it forms blocking portion 34 together with transparent portion 40 describes a (close-to-perfect) solid plate shape. Lens element 38 can redirect light by refraction and/or by diffraction.

Baffle member 26 can provides shielding of undesired light, in particular light leaving module 12 or incident to module 12 at a desired angle. Baffle member 26 can have a transparent region 42 which can be formed as an opening or by means of transparent material. Outside the transparent region 42, baffle member 26 can be made, for example, of a material substantially attenuating or blocking light. The shape of baffle member 26, or more precisely the shape of transparent region 42, can differ from what is shown in FIG. 2 (e.g., cone-like shapes or a truncated pyramid).

The illustrated module 12 provides a packaged active opto-electronic component. Vertical side walls and a bottom wall of module 12 are formed, respectively, by substrate 20, and spacer 22, optics member 24 and baffle 26. The module, however, does not have to be a stacked module; for example, discrete components on a flex cable also can be hidden using the described techniques.

Atop baffle 26 is an optical component 44 that serves as a top wall of module 12. In combination, substrate 20, and spacer 22, optics member 24, baffle 26 and optical component 44 provide a housing for active optical component 16. Optical component 44 allows light emitted, for example, by active optical component 16 to exit module 12, but substantially prevents the internal components of module 12 from being viewed from outside the module (at least when light is not being emitted by active optical component 16). Preferably, optical component 44 is composed of material(s) such that when module 12 is installed in electronic appliance 10, module 12 is substantially indistinguishable visibly from the outer surface of electronic appliance 10. For example, in some implementations, an exterior surface of electronic appliance 10 has a black appearance; likewise, the materials for optical component 44 can have a black appearance (at least when light is not being emitted from module 12 by active optical component 16).

Figure 3:
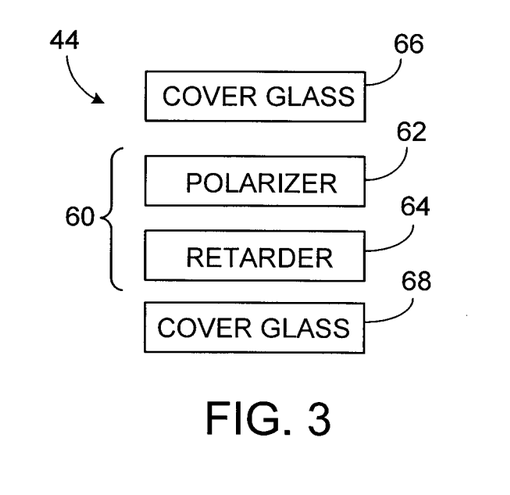
FIG. 3 illustrates an example structure of a cover for the opto-electronic module, the cover including an optical diode.

FIG. 3 illustrates a first example of the structure of optical component 44 according to some implementations. As shown in FIG. 3, optical component 44 includes an optical diode 60 (sometimes referred to as an optical isolator) disposed between an upper cover glass 66 and a lower cover glass 68. Optical diode 60 can be formed as a linear polarizer 62 on an optical quarter-wave retarder 64. Optical diode 60 can be used to substantially prevent light (e.g., in the visible range, i.e., about 390 nm to about 750 nm) that enters module 12 from being emitted back through optical component 44.

Figure 4:
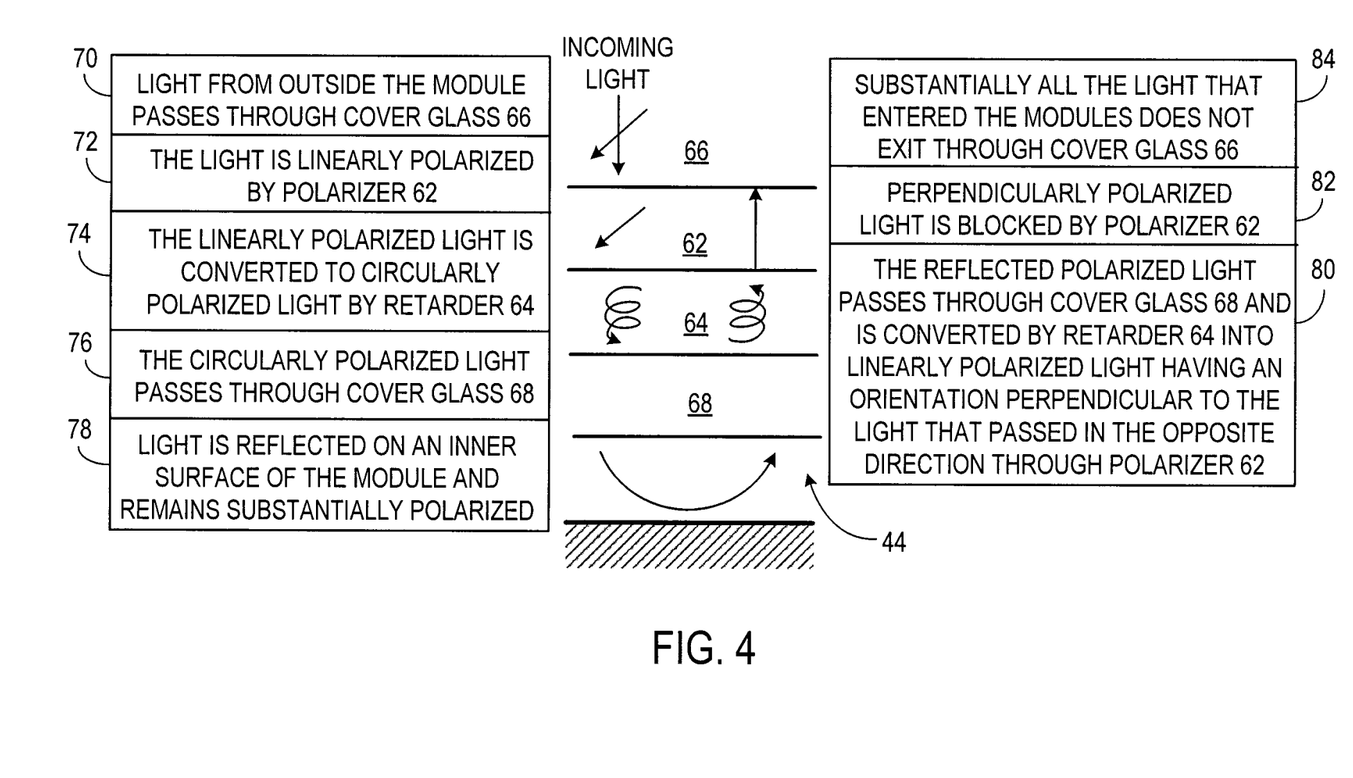
FIG. 4 is a schematic drawing describing operation of the structure of FIG. 3.

In particular, as explained in connection with FIG. 4, light from outside module 12 may pass through upper cover glass 66, which serves as opening 14 in electronic appliance 10. Such light typically includes non-polarized light in the visible spectrum (see block 70). The light then is polarized linearly by polarizer 62 (block 72). The linearly polarized light is converted by retarder 64 to circularly polarized light (block 74), which passes through lower cover glass 68. Inside module 12, the circularly polarized light may be reflected off one or more surfaces back toward optical component 44 (block 78). The reflected light, which initially remains circularly polarized, passes back through lower cover glass 68 and then through retarder 64, which converts the light into linearly polarized light having an orientation that is substantially perpendicular to the light that passed through polarizer 62 in the opposite direction (block 80). The perpendicularly polarized light is blocked by polarizer 62 (block 82) and, therefore, substantially all the external light that entered module 12 does not exit through cover glass 66 (block 84). Thus, while the LED or other optical component 16 is in an inactive state (i.e., not emitting light), the internal components of module 12 are substantially not visible when looking at electronic appliance 10.

Linear polarizer 62 can be implemented, for example, as an absorptive polarizer. Such linear polarizers can have a microscopic orientation of the material that leads to much higher absorption of one polarization. Examples include polymers (e.g., cellophane, polyvinylalkohol), buffer materials filled with oriented micro and nano particles (e.g., herapathite), or nano rods), structured metal films (e.g., holographic polarizers, lined polarizers), and micro-structured surfaces. In some applications, the thickness of the linear polarizer 62 is in a range of about a few hundred nanometers (e.g., for structured metal films) to several hundred microns (e.g., for polymers). Other materials and thicknesses may be appropriate for some implementations.

Retarder 64 can be implemented, for example, using a birefringent material. Examples include naturally birefringent crystals (e.g., quartz, calcite, sapphire), stress birefringent materials (e.g., polycarbonate), liquid crystals, and polymers (e.g., uniaxially stretched cellulose diacetate). In some applications, the thickness of the retarder 64 is in a range of about 1 µm (e.g., for birefringent crystals, zero order) to 200 µm (e.g., for polymers and liquid crystals). Other materials and thicknesses may be appropriate for some implementations.

Figure 5:
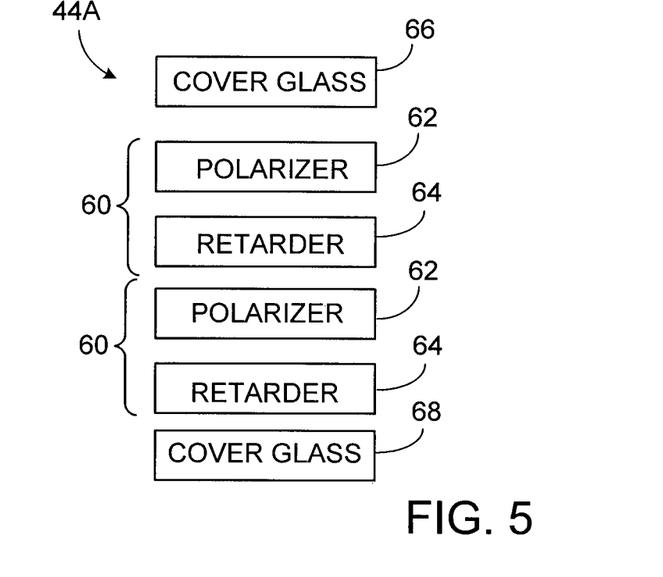
FIG. 5 illustrates another example of a structure of a cover for the opto-electronic module.

In some implementations, two or more optical diodes 60 can be stacked one atop the other, as shown for example in FIG. 5, to increase the amount of external light that is captured by module 12 or to enhance the flatness of the spectral blocking and transmission. The two optical diodes 60 in the optical component 44A of FIG. 5 may have substantially the same optical characteristics or may have somewhat different optical characteristics so as to achieve the desired overall features for optical component 44. For example, the two optical diodes 60 may be designed for different parts of the visible spectrum.

Figure 6:
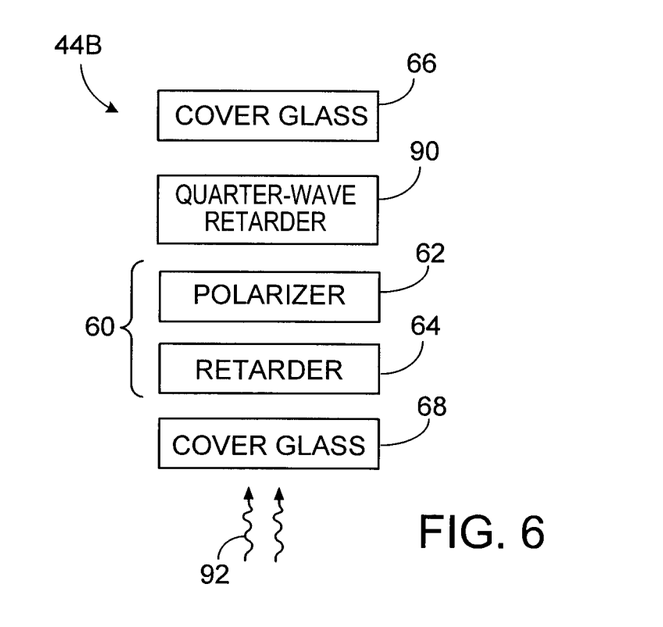
FIG. 6 illustrates yet another example of a structure of a cover for the opto-electronic module.

For some implementations, it is desirable to incorporate another quarter-wave retarder 90 into the optical component, as shown in FIG. 6. In this case, the optical component 44B includes a quarter-wave retarder 90 on the outer surface of optical diode 60. For example, if module 12 includes a LED or other light emitting element 16, the LED light 92 that passes through polarizer 62 is transformed into circularly polarized light by quarter-wave retarder 90. The light emitted from module 12 thus behaves similarly to non-polarized light in some applications (e.g., photography). Furthermore, in this arrangement, optical diode 60 will be substantially insensitive to the orientation of incoming light that is polarized or partially polarized.

Figure 7:
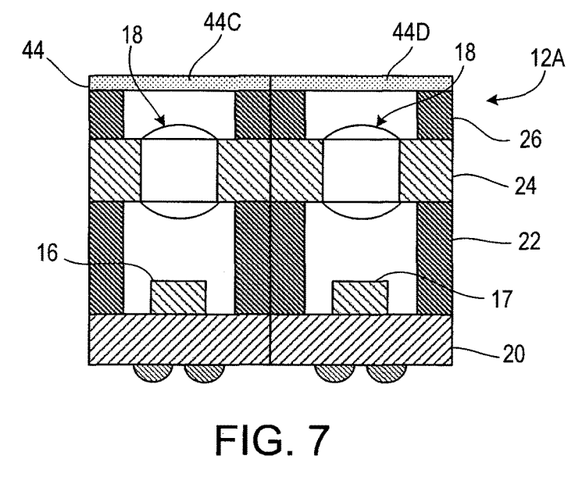
FIG. 7 depicts another example of an opto-electronic module.

Some modules include both a light emitting element (e.g., a LED) as well as a light detecting element (e.g., a photodiode) to detect light at the wavelength(s) emitted by the light emitting element. An example is illustrated in FIG. 7, which shows a module 12A that includes a light emitting element 16 and a light detecting element 17 mounted on substrate 20. The light emitting and light detecting elements 16, 17 can be separated from one another by vertical wall portions of separation member 22, optics member 24 and baffle member 26 which can help prevent stray light emitted by light emitting element 16 from reaching light detecting element 17. Respective passive optical elements 18 are positioned above each of light emitting and light detecting elements 16, 17. In addition, optical component 44, including an optical diode as described above, can be provided over baffle member 26 such that optical component 44 extends over both the light emitting element 16 and the light detecting element 17. In some implementations, the particular layers of optical component 44 that are above light emitting element 16 and light detecting element 17 can be selected to optimize some desired performance. Thus, optical component 44 may have a first region 44C above light emitting element 16 and a second region 44D above light detecting element 17. Although both regions 44C and 44D can include, for example, an optical diode between layers of cover glass as described above, in some implementations, the orientation of the optical polarizer above each of the light emitting element 16 and light detecting element 17 may differ. Likewise, an additional quarter-wave retarder can be applied over one or both of the light emitting element 16 and the light detecting element 17.

The foregoing implementations include upper and lower cover glass layers 66, 68, which can help protect the optical diode layers from environmental conditions, such as humidity. However, some implementations do not include one or both of the cover glass layers 66, 68.

In the foregoing implementations, optical component 44 (or 44A, 44B) is separate from optical component 18. However, in some implementations, the optical component 44 can be integrated with optical component 18.

The foregoing implementations show optical component 44 (or 44A, 44B), including the optical diode 60, as provided across the top of the module 12 (or 12A). In such implementations, module 12 (or 12A) can be fabricated as part of a wafer-level process in which multiple modules are fabricated simultaneously. A dicing process can then be used to separate the wafers into individual modules 12 (or 12A).

Figure 8:
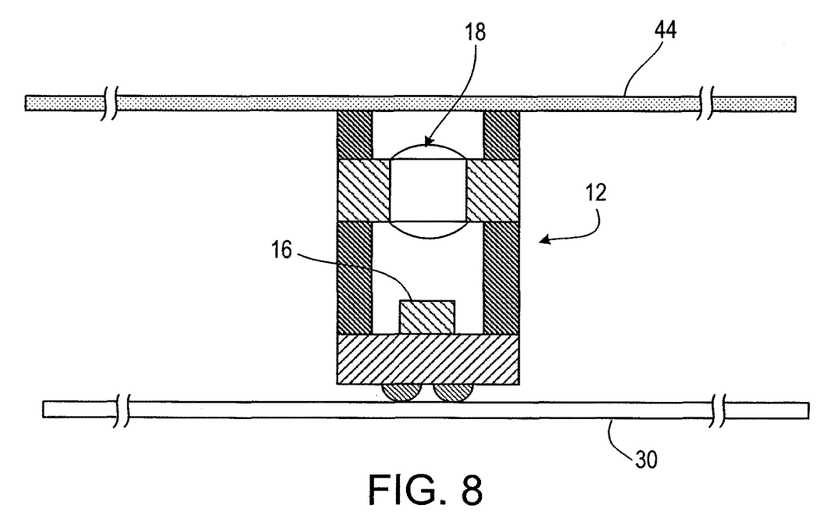
FIG. 8 illustrates another implementation of the structure of a cover for the opto-electronic module.

In other implementations, optical component 44 can cover not only the top of module 12 (or 12A), but also other parts of electronic appliance 10, as shown, for example, in FIG. 8. In such implementations, optical component 44 (or 44A, 44B) would not be included as part of the wafer level fabrication process, but would be provided after the modules are diced. Thus, optical component 44 may form, for example, an entire side, or a portion of a side, of the housing for electronic appliance 10.

Figure 9:
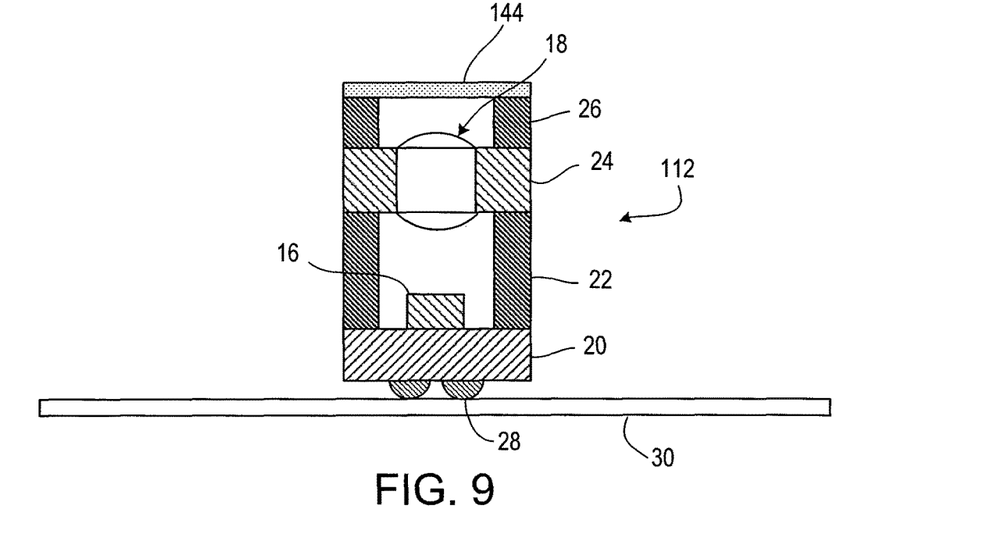
FIG. 9 illustrates another example structure of a cover for the opto-electronic module, the cover including a saturable optical absorber.

FIG. 9 illustrates another example of a module 112 that can be incorporated into electronic appliance 10. Module 112 is similar to module 12 described above, except that it includes a saturable optical absorber (SOA) 144 as an optical component that covers module 112 and that is substantially non-transparent (e.g., to visible light) when light emitting element 16 is in its inactive state. Saturable absorption is a property of materials where the absorption of light decreases with increasing light intensity. At sufficiently high incident light intensity, atoms in the ground state of a saturable absorber material become excited into an upper energy state at such a rate that there is insufficient time for them to decay back to the ground state before the ground state becomes depleted, and the absorption subsequently saturates. Thus, while saturable optical absorber 144 is in the non-transparent state, substantially all the light in a specified wavelength range (e.g., the visible spectrum) from outside module 112 that impinges on the saturable optical absorber can be absorbed so that the interior components of the electronic appliance 10 are not readily visible when viewed from outside the housing (e.g., when looking at window 14). On the other hand, when light emitting element 16 becomes active and emits light at a sufficiently high intensity, it causes saturable optical absorber 144 to become transparent (i.e., transmissive) so that light emitted by light emitting element 16 can pass through saturable optical absorber 144 and exit module 112. When light emitting element 16 subsequently stops emitting light, saturable optical absorber 144 again becomes absorptive after a time that depends on the intrinsic upper-state lifetime.

An example of an application for module 112 is as a flash that includes a LED as light emitting element 16. When the flash LED is turned on and emits light, a small initial portion of the light is absorbed by saturable optical absorber 144, which then becomes transparent and allows most of the light emitted by the flash LED to pass out of module 112. When the flash switches off, saturable optical absorber 144 becomes absorptive again.

Various materials are available for use as saturable optical absorber 144. For example, commercially available saturable optical absorbers suitable for use in the present invention can be obtained from BATOP GmbH of Germany. In some implementations, it is desirable to choose a saturable optical absorber that has a black-appearance and that has broad absorption in the visible spectrum. Thus, if module 112 is integrated into electronic appliance 10, then when saturable optical absorber 144 is in its absorptive state, interior components of electronic appliance 10 will not be readily visible when viewed from outside the housing (e.g., when looking at saturable optical absorber 144 which serves as window 14).

Another factor that can impact the selection of an appropriate material for saturable optical absorber 144 is the material's excited state lifetime. For example, if light emitting element 16 in module 112 serves as a flash for a camera, it may be desirable for the excited state lifetime to be on the order of 2-5 times longer than the duration that window 14 needs to remain transmissive. In some implementations, the excited state lifetime would be on the order of about one hundred milliseconds. In other implementations, different values of the excited state lifetime may be desirable.

Figure 10:
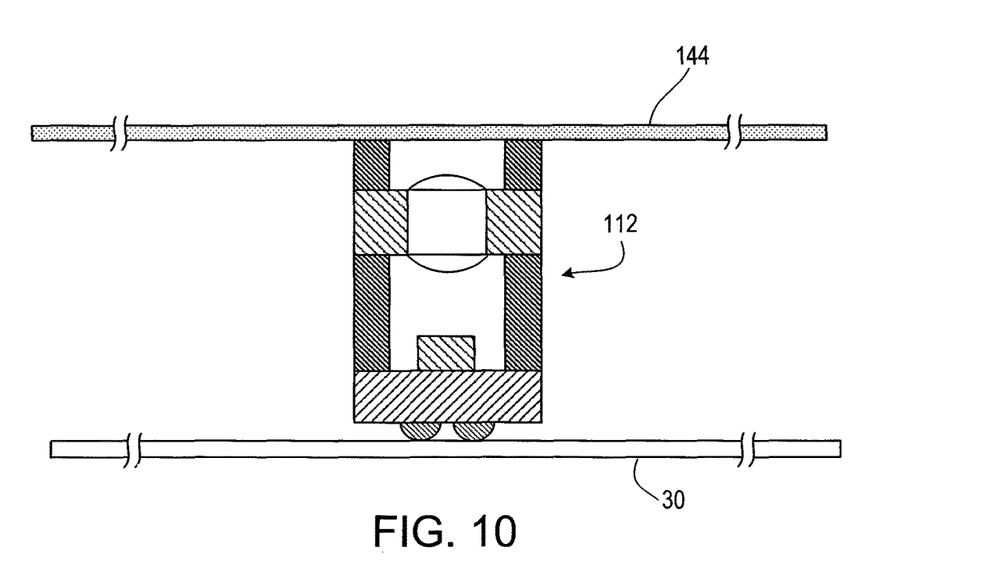
FIG. 10 illustrates another implementation of the structure of a cover for the opto-electronic module.

The foregoing implementations illustrate saturable optical absorber 144 as provided across the top of module 112. In such implementations, module 112 can be fabricated as part of a wafer-level process in which multiple modules are fabricated simultaneously. A dicing process can then be used to separate the wafers into individual modules 112. In other implementations, saturable optical absorber 144 can cover not only the top of module 112, but also covers other parts of electronic appliance 10 (see FIG. 10). In such implementations, saturable optical absorber 144 would not be included as part of the wafer level fabrication process, but would be provided after the modules are diced. Thus, saturable optical absorber 144 may form, for example, an entire continuous side, or a portion of a side, of the housing for electronic appliance 10.

The various implementations including the optical diode or saturable optical absorber can be referred to as a means for filtering light that impinges on an outer surface of the housing such that light in the visible part of the spectrum impinging on the outer surface of the housing where the means for filtering is located is substantially absorbed by the means for filtering or is substantially prevented from passing back out of the housing through the means for filtering. In some implementations, the means for filtering also can allow light emitted by an opto-electronic device (i.e., in the case of a light emitting element) at a particular wavelength or range of wavelengths to pass out of the housing. Such light may even include light in the visible part of the spectrum in some cases. In other implementations, the means for filtering can allow light at a particular wavelength or range of wavelengths (e.g., in the IR or near-IR part of the spectrum) to pass through the means for filtering into an interior area of the housing so as to be sensed by the opto-electronic device (i.e., in the case of a light detecting element).

The various implementations described above (e.g., an optical component 44 with optical diode 60 or a saturable optical absorber 144 as a cover for module) can be used regardless of whether or not the module itself includes a light emitting element 16. However, if the module itself does not include a light emitting element and if a saturable optical absorber is provided as the cover to the module, then a LED (or other light emitting element) should be placed in close proximity to the saturable optical absorber 144. For example, if the module includes a light sensor but not a light emitting element, then when the light sensor is activated to sense incoming light, the LED is switched on to make the saturable optical absorber transparent to the incoming light. The LED can be switched off at the appropriate time, so that the saturable optical absorber becomes absorptive again. Such operation can be considered semi-passive.

In the foregoing implementations, saturable optical absorber 144 is an optical component that is separate from optical component 18. However, in some implementations, the saturable optical absorber can be integrated with the optical component 18. For example, optics member 24 can be composed of a material that functions as a saturable optical absorber or the transparent portion 40 of optical member 24 can be doped with an appropriate material so that it function as a saturable optical absorber.

The modules described above are examples, and the details of other modules may differ in various aspects. Thus, an optical component including an optical diode 60 or a saturable optical absorber 144 can be used as a cover for a wide range of optical modules, which may contain one or more optical, electro-optical and/or thermo-optical elements. Likewise, such modules can be integrated into a wide range of electronic appliances. As described above, cover 44 (or 144) can serve as at least a portion of a wall of the housing for electronic appliance 10. In situations where cover 44 (or 144) serves as only a portion of the housing wall, its exterior surface can be made substantially flush with the exterior surface of the housing wall, and the appearance of exterior surfaces of cover 44 (or 144) and the housing wall can be substantially similar. Furthermore, use of cover 44 (or 144) can provide a sealed surface.

Other implementations are within the scope of the claims.

What is claimed is:

1. An opto-electronic module comprising:
   a substrate;
   a light emitting element mounted on the substrate;
   an optical element aligned with the light emitting element;
   a spacer member disposed between the substrate and the optical element, the spacer member surrounding the light emitting element; and
   a saturable optical absorber above the optical element, such that the optical element is disposed between the saturable optical absorber and the light emitting element.

2. The opto-electronic module of claim 1 wherein when the light emitting element is turned on, it emits light at an intensity that causes the saturable optical absorber to become transparent to the emitted light.

3. The opto-electronic module of claim 2 wherein the saturable optical absorber is absorptive when the light emitting element is turned off.

4. The opto-electronic module of claim 2 wherein the saturable optical absorber is substantially non-transparent to light in the visible spectrum when the light emitting element is turned off.

* * * * *